United States Patent [19]
Shinoda

[11] Patent Number: 4,811,295
[45] Date of Patent: Mar. 7, 1989

[54] HIGH SPEED SERIAL INPUT/OUTPUT SEMICONDUCTOR MEMORY

[75] Inventor: Takashi Shinoda, Hamura, Japan

[73] Assignee: Hitachi, Ltd., Tokyo, Japan

[21] Appl. No.: 31,425

[22] Filed: Mar. 26, 1987

[30] Foreign Application Priority Data

Mar. 28, 1986 [JP] Japan .................................. 61-068311

[51] Int. Cl.⁴ ............................................... G11C 7/00
[52] U.S. Cl. ..................................... 365/189; 365/219; 365/230
[58] Field of Search .......................... 365/189, 219, 230

[56] References Cited

U.S. PATENT DOCUMENTS 3,787,817  1/1974  Goldberg ............................ 365/219
4,633,441 12/1986  Ishimoto .............................. 365/230

Primary Examiner—James W. Moffitt
Attorney, Agent, or Firm—Fay, Sharpe, Beall, Fagan, Minnich & McKee

[57] ABSTRACT

A pseudo static RAM having a function which enables high-speed serial read and write operations with a relatively simple circuit configuration. In the stage subsequent to an amplifier for amplifying read signals from memory cells which are output to complementary common data lines, there are provided a first flip-flop for transmitting the output signal from the amplifier to an output buffer in an ordinary read operation, a second flip-flop connected between the amplifier and the first flip-flop in a serial read operation so as to transmit the output signal from the amplifier to the output buffer in cooperation with the first flip-flop, and an address counter for successively selecting a plurality of data lines.

9 Claims, 5 Drawing Sheets

HIGH SPEED SERIAL INPUT/OUTPUT SEMICONDUCTOR MEMORY

BACKGROUND OF THE INVENTION

The present invention relates to a semiconductor memory and, more particularly, to a technique which may effectively be applied to, for example, a semiconductor memory having a serial read function.

One type of dynamic RAM (Random-Access Memory) which has a so-called nibble mode function that enables storage data to be read or written serially, e.g., 4 bits at a time, is described as "HM50257 series" in, for example, "Hitachi IC Memory Data Book" published by Hitachi, Ltd., September 1983, pp. 314 to 320.

SUMMARY OF THE INVENTION

FIG. 6 is a circuit block diagram of an output circuit which may be employed in such dynamic RAM having a nibble mode function. In this dynamic RAM, storage data (read signals) are output to four common data lines from memory arrays M-ARY1 and M-ARY2 and respectively amplified by four main amplifiers MA0 to MA3 provided in correspondence with the common data lines and then latched by flip-flops FF0 to FF3, respectively, which are provided in correspondence with the main amplifiers MA0 to MA3. These 4 bit read signals are successively selected by means of a second address decoder DCR2 which decodes the highest significant address signal axm in a row address and the highest significant address signal ayn in a column address, latched by a flip-flop FF4 which constitutes a second flip-flop stage, and then output to the outside from an input/output terminal DI/O through a data output buffer DOB.

I found that the above-described dynamic RAM having a nibble mode function suffers from the following problems. Namely, the read circuit for the dynamic RAM requires four main amplifiers and five flip-flops, which occupy a relatively large area, as shown in FIG. 6. Since storage data is output via two flip-flop stages which are connected in series within the read circuit, the access time of the RAM is undesirably increased. In the case where a continuous serial read operation is effected by repeating the nibble mode while changing the address signals supplied externally, the repetition cycle of the continuous serial read operation also becomes relatively long due to skew between address signals generated when they are changed.

The above-described problems are noticeable in semiconductor memories of the type which has a plurality of data output terminals and simultaneously outputs a plurality of data items. For example, a pseudo static RAM has 8 data input/output terminals and simultaneously inputs or outputs 8 bit data. In this case, it is necessary, in order to realize the above-described output function for each bit, to provide 32 main amplifiers and 40 flip-flops. Consequently, this device impractically involves the following disadvantages: the area occupied by the peripheral circuits is considerably increased; power consumption increases; and the simultaneous operation of these circuits causes generation of large noise on power supply wiring (wiring for supplying a power supply voltage or a circuit ground potential).

It is an object of the present invention to provide a semiconductor memory which is capable of performing a high-speed serial operation with a relatively simple circuit configuration.

It is another object of the present invention to provide a semiconductor memory having a function which enables data constituted by a plurality of bits to be output serially.

The above and other objects, novel features and advantages of the present invention will become clear from the following description of the preferred embodiment thereof, taken in conjunction with the accompanying drawings.

A representation of one of the novel techniques disclosed in this application will briefly be described below.

Each of the main amplifiers which are respectively supplied with read signals through common data lines is provided with a first flip-flop for transmitting read data from the main amplifier to an output circuit in an ordinary read operation and a second flip-flop which receives an output signal from the main amplifier and transmits it to the output circuit in a serial read operation. Further, during a serial read operation, an address counter switches over data lines from one to another while an output signal from the second flip-flop is transmitted to the output circuit.

By virtue of the above-described means, while the output signal from the main amplifier which is supplied to the second flip-flop is transmitted to the output circuit, the address counter switches over columns one from another, and storage data which is different from said output signal is amplified in the main amplifier. By repeating this operation, a high-speed serial read operation can be realized.

DESCRIPTION OF THE PREFERRED EMBODIMENT

Figure 2:
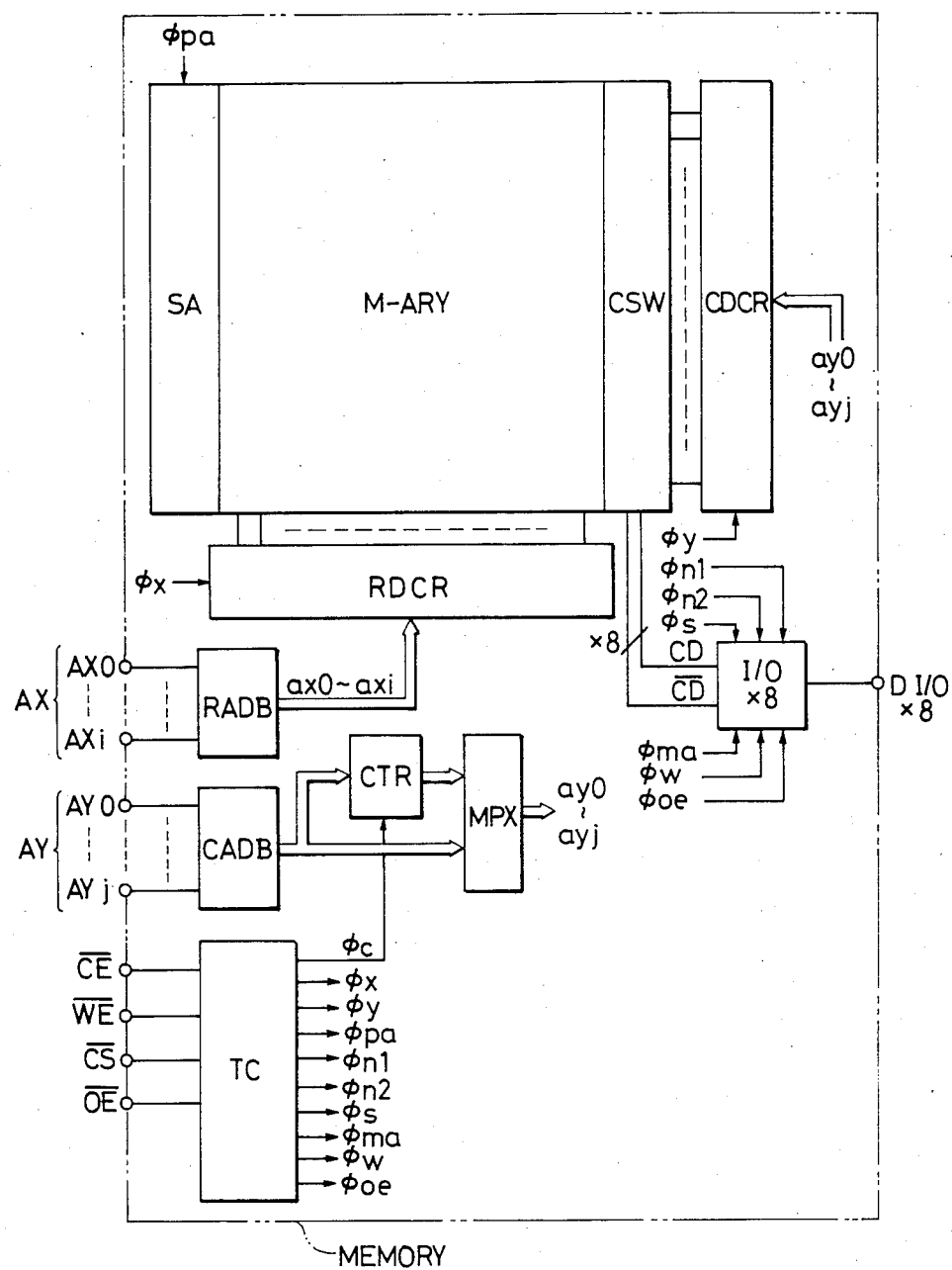
FIG. 2 is a block diagram of one embodiment of the present invention in which the invention is applied to a dynamic RAM.

FIG. 2 is a block diagram of one embodiment of the present invention in which the invention is applied to a dynamic RAM. The dynamic RAM in accordance with this embodiment has an ordinary dynamic RAM memory cell, that is, a 1 MOSFET (Metal Oxide Semiconductor Field Effect Transistor) type dynamic memory cell, and is employed as a so-called pseudo static RAM which is compatible in terms of control with ordinary static RAMs.

Accordingly, among circuit blocks shown in FIG. 2, circuit blocks which are on the periphery of a memory array M-ARY are constituted by CMOS (Complementary MOS) static circuits, respectively. Circuit elements which constitute each circuit block are formed on a single semiconductor substrate, for example, single crystal silicon, by means of a known technique for producing semiconductor integrated circuits.

External terminals for supplying row (X) and column (Y) address signals AX and AY are formed independently of each other. A total of eight data input/output terminals DI/O are provided. Signals $\overline{CE}$, $\overline{CS}$, $\overline{WE}$ and $\overline{OE}$ for controlling the operation of the memory are supplied through respective external terminals.

The memory array M-ARY shown in FIG. 2 comprises word lines disposed vertically as viewed in the figure, complementary data lines disposed horizontally, and 1 MOSFET type dynamic memory cells respectively formed at the intersections between the word and complementary data lines.

A unit circuit of a sense amplifier SA is provided in correspondence with each pair of complementary data lines. Although not necessarily limitative, when one word line is selected, unit circuits of the sense amplifier SA which are connected to all the data lines, respectively, are simultaneously made operative in response to a timing signal $\phi pa$.

An X address signal AX (including a plurality of bit signals AX0 to AXi) which is supplied externally is fetched to a row address buffer RADB which then forms complementary address signals ax0 to axi comprising internal address signals which are in phase with the corresponding external address signals and internal address signals which are anti-phase with respect to the external address signals. These complementary address signals are transmitted to a row address decoder RDCR. The decoder RDCR decodes the complementary address signals ax0 to axi supplied thereto from the row address buffer RADB and selects one word line specified by the complementary address signals in synchronism with a timing signal $\phi x$.

A Y address signal AY (including a plurality of bit signals AY0 to AYj) is fetched to a column address buffer CADB which then forms complementary address signals ay0 to ayj in a manner similar to that in the case of the row address signal. The complementary address signals ay0 to ayj, on the one hand, are supplied to one input terminal of a multiplexer MPX and thus transmitted to a column address decoder CDCR through the multiplexer MPX. On the other hand, the output signals ay0 to ayj from the column address buffer CADB are supplied to an address counter CTR (described later) as initial values. The other input terminal of the multiplexer MPX is supplied with internal address signals which are formed in the address counter CTR. During an ordinary (or random) read or write operation, the multiplexer MPX transmits complementary address signals supplied from the column address buffer CADB to the column address decoder CDCR, whereas, during a continuous serial read or write operation, the multiplexer MPX transmits internal address signals supplied from the address counter CTR to the column address decoder CDCR. The operation of the multiplexer MPX is controlled by means of a signal supplied from a timing control circuit TC (described later).

The column address decoder CDCR decodes the complementary address signals ay0 to ayj transmitted thereto from the multiplexer MPX and forms data line select signals for selecting eight complementary data lines specified by the complementary address signals in synchronism with a timing signal $\phi y$. Eight complementary data lines corresponding to one column address may be disposed adjacent to each other within the memory array M-ARY or may be formed at predetermined positions, respectively, which are spaced away from each other.

The address counter CTR fetches the initial values ay0 to ayj during a serial operation and performs a step-up operation in response to a stepping timing signal $\phi c$ supplied from the timing control circuit TC (described later). Although not necessarily limitative, setting of initial values for the address counter CTR is effected substantially synchronously with the first fall of a chip enable signal $\overline{CE}$. Accordingly, the column address buffer CADB starts its operation in synchronism with the first fall of the chip enable signal $\overline{CE}$. In order to avoid complication of timing signals, the row address buffer RADB operates at the same timing as the column address buffer CADB. The output of the address counter CTR is used as a column address signal in a serial read or write operation. Accordingly, the address counter CTR outputs a number of bits which is the same as the number (j+1) of bits constituting the column address signal AY. Although not necessarily limitative, the output signal from the highest significant bit of the address counter CTR is fed back to the least significant bit of the counter CTR as an input signal thereto. Thus, even when complementary data lines are selected from a halfway position in a serial operation, all memory cells connected to one word line can be selected with one address input.

Data line select signals which are formed by means of the column address decoder CDC are sent to a column switch CSW comprising unit circuits provided in correspondence with the complementary data lines, respectively, in the memory array M-ARY. The column switch CSW selects eight complementary data lines specified by the internal complementary address signals ay0 to ayj from a plurality of data lines, and connects the selected complementary data lines to the corresponding eight complementary common data lines CD and $\overline{CD}$. As result, eight memory cells corresponding to one address are respectively connected to the eight complementary common data lines CD and $\overline{CD}$.

The eight complementary common data lines CD and $\overline{CD}$ are connected to eight input/output circuits I/O, respectively. Eight data input/output terminals DI/O are provided in correspondence with the eight input/output circuits I/O, respectively. Read signals from the memory cells which are supplied to the complementary common data lines CD and $\overline{CD}$ are respectively amplified in the input/output circuits I/O before being output to the input/output terminals DI/O. Data to be written which are supplied externally through the input/output terminals DI/O are formed into complementary data by means of the input/output circuits I/O and sent to respective memory cells through the complementary common data lines CD and $\overline{CD}$.

The timing control circuit TC receives a chip enable signal $\overline{CE}$, a write enable signal $\overline{WE}$, a chip select signal $\overline{CS}$ and an output enable signal $\overline{OE}$, which are supplied externally, and forms various kinds of timing signals represented by the above-described stepping timing signal and supplies the timing signals to various circuits, although not necessarily limitative thereto.

The pseudo static RAM of the type described above is disclosed in U.S. patent application Ser. No. 902,564 filed on Sept. 2, 1986, which is cited as a reference in this specification.

The memory array M-ARY, the sense amplifier SA and the column switch CSW are the same as those of U.S. patent application Ser. No. 902,564. The row and column address buffers RADB and CADB, the row and column address decoders RDCR and CDCR and the multiplexer MPX respectively have known arrangements constituted by CMOS static circuits. The address counter CTR is substantially the same as that of U.S. patent application Ser. No. 902,564 and is arranged to output complementary signals.

Figure 1:
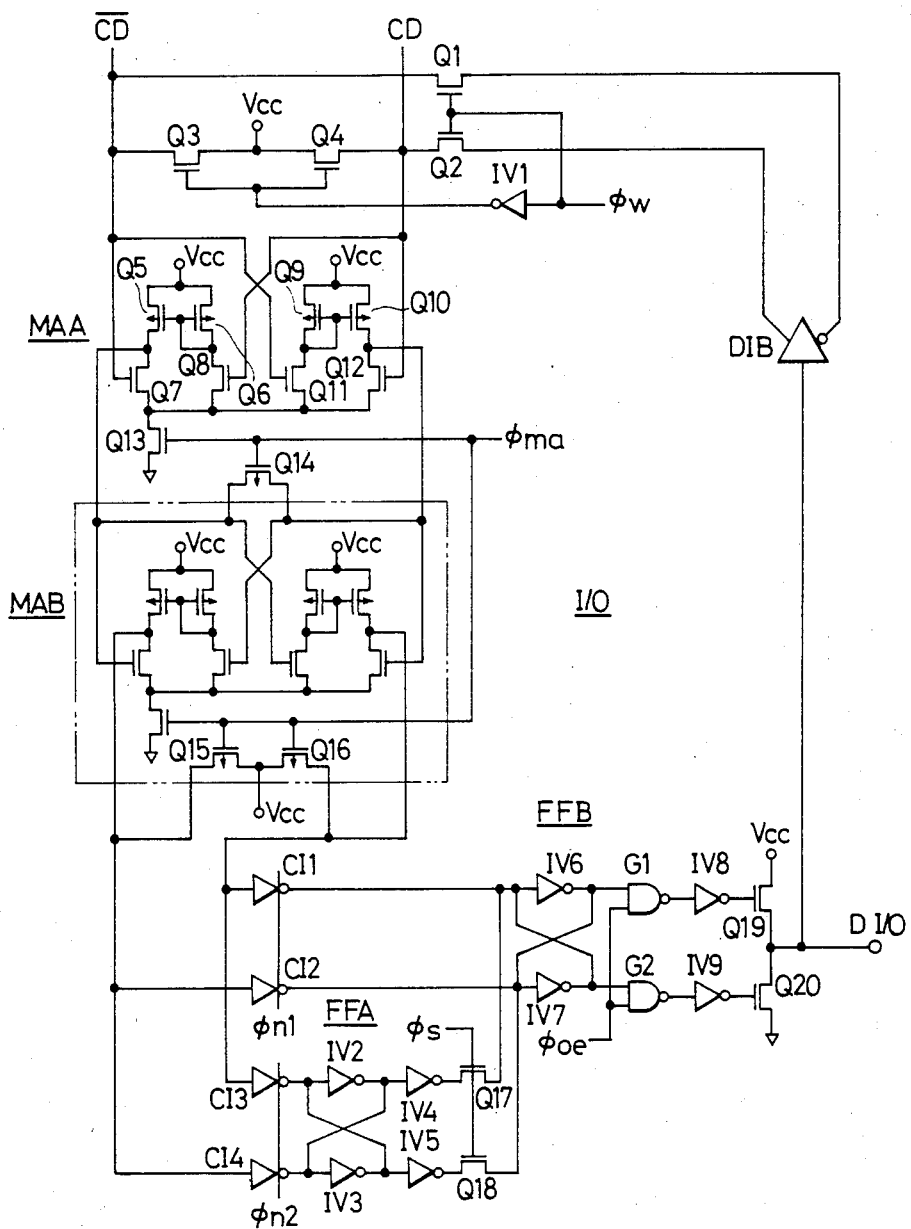
FIG. 1 a circuit diagram of one example of an input/output circuit in a dynamic RAM to which the present invention is applied.

FIG. 1 is a circuit diagram of one input/output circuit I/O in the dynamic RAM shown in FIG. 2. The pseudo static RAM in accordance with this embodiment has a main amplifier comprising amplifier circuits MAA and MAB which are arranged so as to constitute a two-stage main amplifier circuit, and in the stage subsequent to the amplifier circuit MAB, there are provided two flip-flops, that is, a first flip-flop FFB which transmits the read data which is amplified in the amplifier circuit MAB to the input/output terminal DI/O in an ordinary read operation, and a second flip-flop FFA which is connected in series between the amplifier circuit MAB and the flip-flop FFB in a serial read operation so as to continuously transmit read data to the input/output terminal DI/O in cooperation with the flip-flop FFB.

In FIG. 1, P- and N-channel MOSFETs are distinguished from each other in such a way that arrows are added to the channel regions of the P-channel MOSFETs only.

Although not necessarily limitative, this integrated circuit is formed on a semiconductor substrate defined by P-type single crystal silicon. Each of the N-channel MOSFETs comprises N-type source and drain regions formed in the surface of the semiconductor substrate and a gate electrode which is formed on the surface of the semiconductor substrate between the source and drain regions through a thin gate insulator film. The P-channel MOSFETs are formed in an N-type well region provided in the surface of the semiconductor substrate. The semiconductor substrate defines a body gate which is common to a plurality of N-channel MOSFETs formed thereon. The N-type well region defines a body gate for the P-channel MOSFETs formed thereon. The body gate of the P-channel MOSFETs, that is, the N-type well region, is connected to a power supply terminal Vcc.

Complementary signals read out from memory cells are output to complementary common data lines CD and $\overline{CD}$ from the memory array M-ARY and input to a pair of input terminals of a main amplifier MA. The main amplifier MA comprises first- and second-stage differential amplifier circuits MAA and MAB each composed of a pair of differential amplifiers. One of the differential amplifiers which constitute the first-stage differential amplifier circuit MAA includes N-channel differential amplifier MOSFETs Q7, Q8, P-channel load MOSFETs Q5, Q6 which are respectively provided between the power supply terminal Vcc and the drains of the MOSFETs Q7, Q8, and an N-channel driver MOSFET Q13 which is provided between the mutually connected sources of the differential amplifier MOSFETs Q7, Q8 and a ground potential point of the circuit. The load MOSFETs Q5 and Q6 are arranged in the form of a current mirror to thereby constitute an active load circuit. The other differential amplifier of the first-stage differential amplifier circuit MAA includes N-channel differential amplifier MOSFETs Q11, Q12 and P-channel load MOSFETs Q9, Q10 in the same manner as in the case of the first differential amplifier. The sources of the differential amplifier MOSFETs Q11 and Q12 are mutually connected to the sources of the differential amplifier MOSFETs Q7 and Q8 of the first differential amplifier, and the operation of the MOSFETs Q11 and Q12 is controlled by means of the driver MOSFET Q13. The gate of the N-channel MOSFET Q7 which defines an inverting input terminal of the first differential amplifier and the gate of the N-channel MOSFET Q11 which defines a non-inverting input terminal of the second differential amplifier are coupled to the complementary common data line $\overline{CD}$. The gate of the N-channel MOSFET Q8 which defines a non-inverting input terminal of the first differential amplifier and the gate of the N-channel MOSFET Q12 which defines an inverting input terminal of the second differential amplifier are coupled to the complementary common data line CD. The drains of the MOSFETs Q7 and Q12 which define output terminals of the first-stage differential amplifier circuit MAA are respectively coupled to input terminals of the second-stage differential amplifier circuit MAB and further respectively coupled to the source and drain of a P-channel precharge (short) MOSFET Q14 which is provided between the output terminals. The gates of the precharge MOSFET Q14 and the driver MOSFET Q13 are supplied with a timing signal $\phi$ma for controlling the operation of the main amplifier from the timing control circuit TC. Thus, when the timing signal $\phi$ma is at a low level, that is, when the differential amplifier circuit MAA is in an inoperative state, the precharge MOSFET Q14 is turned ON to equalize the voltage level at each of the output terminals of the differential amplifier circuit MAA. When the timing signal $\phi$ma is at a high level, the driver MOSFET Q13 is turned ON to connect the differential amplifier circuit MAA to the circuit ground potential, thereby supplying operating current therefor.

As shown within a region surrounded by the two-dot chain line in FIG. 1, the second-stage differential amplifier circuit MAB, which is provided in the stage subsequent to the first-stage differential amplifier circuit MAA, has a circuit configuration similar to that of the first-stage differential amplifier circuit MAA. Since circuit elements constituting the second-stage differential amplifier circuit MAB are similar to those of the first-stage differential amplifier circuit MAA, illustration of circuit symbols and description thereof are omitted.

A pair of (or complementary) output signals from the second-stage differential amplifier circuit MAB are respectively input to CMOS clocked inverters CI1, CI3 and CI2, CI4. Output terminals of the second-stage differential amplifier circuit MAB are respectively coupled to the drains of precharge MOSFETs Q15 and Q16 in the same way as in the case of the first-stage differential amplifier circuit MAA. The gates of the precharge MOSFETs Q15 and Q16 are supplied with the timing signal $\phi$ma. Thus, when the second-stage differential amplifier circuit MAB is in an inoperative state wherein the timing signal $\phi$ma is at the low level, the MOSFETs Q15 and Q16 are turned ON to precharge the output terminals of the second-stage differential amplifier circuit MAB to a high level (the power supply voltage Vcc).

The CMOS clocked inverters CI1 and CI2 and the CMOS clocked inverters CI3 and CI4, which are supplied with complementary output signals from the second-stage differential amplifier circuit MAB, are paired together, respectively. The clocked inverters CI1 and CI2 each serving as a switching circuit are supplied with a timing signal φn1 from the timing control circuit TC as a gate (switch) control signal, and when the timing signal φn1 is at a high level, each of the clocked inverters CI1 and CI2 inverts and outputs its input signal. The clocked inverters CI3 and CI4 each serving as a switching circuit are supplied with a timing signal φn2 from the timing control circuit TC as a gate (switch) control signal, and when the timing signal φn2 is at a high level, each of the clocked inverters CI3 and CI4 inverts and outputs its input signal. The timing signal φn1 is raised to the high level during an ordinary (random) read operation of the dynamic RAM, and changed from the high level to a low level during a serial read operation and in synchronism with the first fall of the timing signal φy. On the other hand, the timing signal φn2 is raised to the high level during a serial read operation of the dynamic RAM. The timing signal φn2 is formed by latching and inverting the level of the signal $\overline{CS}$ at the time when the signal $\overline{CE}$ first falls. Output signals from the clocked inverters CI1 and CI2, defined by first switching means are input to the second flip-flop FFB composed of a second data holding means, for example, latch circuits, i.e., CMOS inverter circuits IV6 and IV7. Output signals from the clocked inverters CI3 and CI4, defined by second switching means, are input to the first flip-flop FFA defined by second data holding means, for example, latch circuits, i.e., CMOS inverter circuits IV2 and IV3. Output signals from the flip-flop FFA are respectively inverted by means of CMOS inverter circuits IV4 and IV5 and input to the flip-flop FFB through MOSFETs Q17 and Q18 which constitute transfer gates or switching circuits defined by third switching means. The gates of the transfer gate MOSFETs Q17 and Q18 are supplied with a timing signal φs from the timing control circuit TC. The timing signal φs is raised to a high level in synchronism with the rise of the chip select signal $\overline{CS}$ from a low level to a high level, the signal $\overline{CS}$ being supplied externally, and the timing signal φs being held at the high level for a predetermined period of time.

In the case of an ordinary read operation, read data is output via the clocked inverters CI1, CI2 and the first flip-flop FFB. In the case of a serial read operation, first read data alone is set in both the flip-flops FFA and FFB via both the clocked inverters and data which are read thereafter are passed through the clocked inverters CI3 and CI4 and set in the second flip-flop FFA, and then shifted to the first flip-flop FFB in synchronism with the timing signal φs and transmitted to the output circuit.

Output signals from the first flip-flop FFB are input to first input terminals of NAND gates G1 and G2. The other, or second, input terminals of the NAND gates G1 and G2 are supplied with a timing signal φoe from the timing control circuit TC, the signal φoe being obtained by inverting the output enable signal $\overline{OE}$. The timing signal φoe is raised to a high level in a read operation at such timing that read data can be output. During a serial read operation, the timing signal φoe is maintained at the high level. As a result, the output circuit (described below), which comprises the gates G1, G2, CMOS inverter circuits IV8, IV9 and MOSFETs Q19, Q20, operates statically during a serial read operation in accordance with the output of the flip-flop FFB.

Output signals from the flip-flop FFB are inverted twice through the NAND gates G1, G2 and the inverter circuits IV8, IV9 and then transmitted to the gates of the output MOSFETs Q19 and Q20, respectively. The output N-channel MOSFETs Q19 and Q20 have a relatively large conductance and output read data supplied to their respective gates to the input/output terminal DI/O. More specifically, when the read data represents the logic "0", the output signal from the inverter circuit IV9 is raised to a high level, thus causing the MOSFET Q20 to turn ON. As a result, a low level signal such as the circuit ground potential is output to the input/output terminal DI/O through the MOSFET Q20. When the read data represents the logic "1", the output signal from the inverter circuit IV8 is raised to a high level, thus causing the MOSFET Q19 to turn ON. As a result, a high level signal such as the circuit power supply voltage Vcc is output to the input/output terminal DI/O. When the RAM is not in read operation, the timing signal φoe is at the low level and both the output signals from the inverter circuits IV8 and IV9 are also at the low level. Accordingly, both the MOSFETs Q19 and Q20 are OFF, and the input/output terminal DI/O is thus placed in a high impedance state.

In a write operation of the dynamic RAM, data which is to be written is input to the input/output terminal DI/O. To the input/output terminal DI/O are coupled the mutually connected drains of the above-described output MOSFETs and an input terminal of a data input circuit DIB. The data input circuit DIB forms complementary write data signals defined by a write signal which is in phase with a write data signal supplied to the input/output terminal DI/O and a write signal which is anti-phase with respect to said write data signal. The complementary write data signals are supplied to the complementary common data lines CD and $\overline{CD}$ through N-channel transfer gate MOSFETs Q1 and Q2, respectively. N-channel load MOSFETs Q3 and Q4 which have a relatively small conductance are provided between the power supply voltage terminal Vcc and the complementary common data lines CD and $\overline{CD}$, respectively.

The gates of the transfer gate MOSFETs Q1 and Q2 for transmitting the complementary write data signals from the data input circuit DIB to the complementary common data lines CD and $\overline{CD}$ are supplied with a timing signal φw from the timing control circuit TC. The gates of the load MOSFETs Q3 and Q4 are supplied with a signal obtained by inverting the timing signal φw through a CMOS inverter circuit IV1. The timing signal φw is raised to a high level when selection of word and data lines in the memory array M-ARY is completed in a write operation and it becomes possible to write data into memory cells. Thus, when the timing signal φw is at a low level, that is, when the RAM is not in write operation, the load MOSFETs Q3 and Q4 are in an ON state, and substantially equal bias levels are thus applied to the complementary common data lines CD and $\overline{CD}$. Application of such bias levels substantially limits the amplitude of signals on the complementary common data lines CD and $\overline{CD}$ during a read operation, and this enables an increase in speed of response to a signal read out from a memory cell. In a write operation wherein the timing signal φw is raised to the high level, the transfer gate MOSFETs Q1 and Q2 are turned ON, and write data supplied to the input/output terminal DI/O is thus output to the complementary common data lines CD and $\overline{CD}$.

Figure 3:
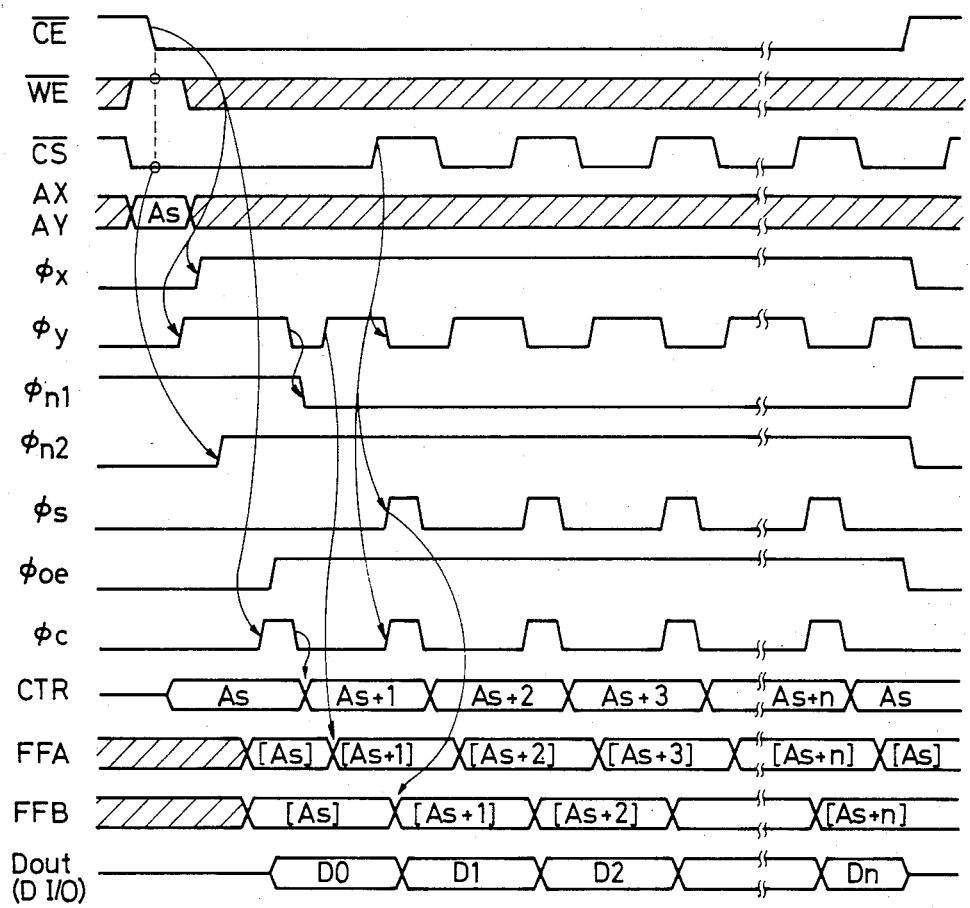
FIG. 3 is a timing chart showing a serial read operation of the dynamic RAM shown in FIG. 2.

FIG. 3 is a timing chart employed to describe a serial read operation of the pseudo static RAM in accordance with this embodiment. A serial read operation of the pseudo static RAM shown in FIGS. 1 and 2 will be described below with reference to the timing chart of FIG. 3.

When the pseudo static RAM of this embodiment performs a continuous serial read or write operation, the chip select signal $\overline{CS}$ changes from the high level to the low level prior to the chip enable signal $\overline{CE}$. Whether a particular serial operation is a serial read operation or a serial write operation is determined according to whether the write enable signal $\overline{WE}$ is at the high level or the low level when the chip enable signal $\overline{CE}$ falls from the high level to the low level. More specifically, if the write enable signal $\overline{WE}$ is at the high level when the chip enable signal $\overline{CE}$ changes from the high level to the low level after the chip select signal $\overline{CS}$ has changed from the high level to the low level, the serial read operation mode is acknowledged. If the write enable signal $\overline{WE}$ is at the low level when the chip enable signal $\overline{CE}$ changes from the high level to the low leve, the serial write operation mode is acknowledged.

The timing control circuit TC controls the operations of the other circuit blocks so as to perform a random read or write, or serial read or write operation on the basis of the various control signals, i.e., $\overline{CE}$, $\overline{CS}$ and $\overline{WE}$. For this purpose, the timing control circuit TC latches the levels of the signals $\overline{CS}$ and $\overline{WE}$ at the timing at which the chip enable signal $\overline{CE}$ falls. The latched signal levels are held in the timing control circuit TC until it is reset in response to, for example a rise of the chip enable signal $\overline{CE}$. On the basis of the latched low level of the signal $\overline{CS}$, the timing control circuit TC causes each of the circuit blocks to perform a serial operation. In this case, the timing control circuit TC allows each circuit block to perform either a serial read or write operation on the basis of the latched high or low level of the signal $\overline{WE}$.

Figure 5:
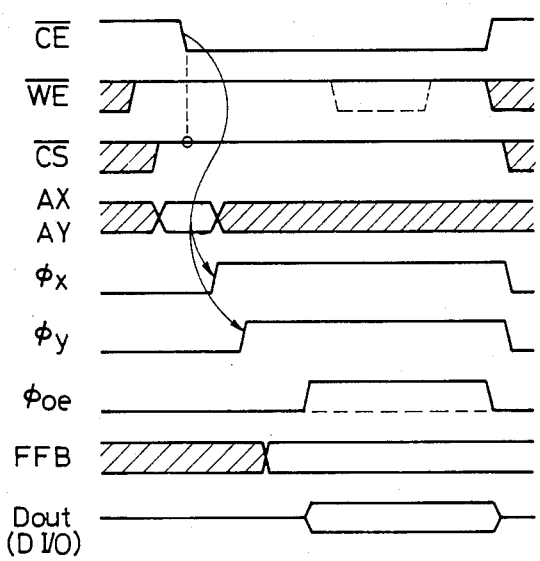
FIG. 5 is a timing chart showing a random-read operation of the dynamic RAM shown in FIG. 2.
Figure 6:
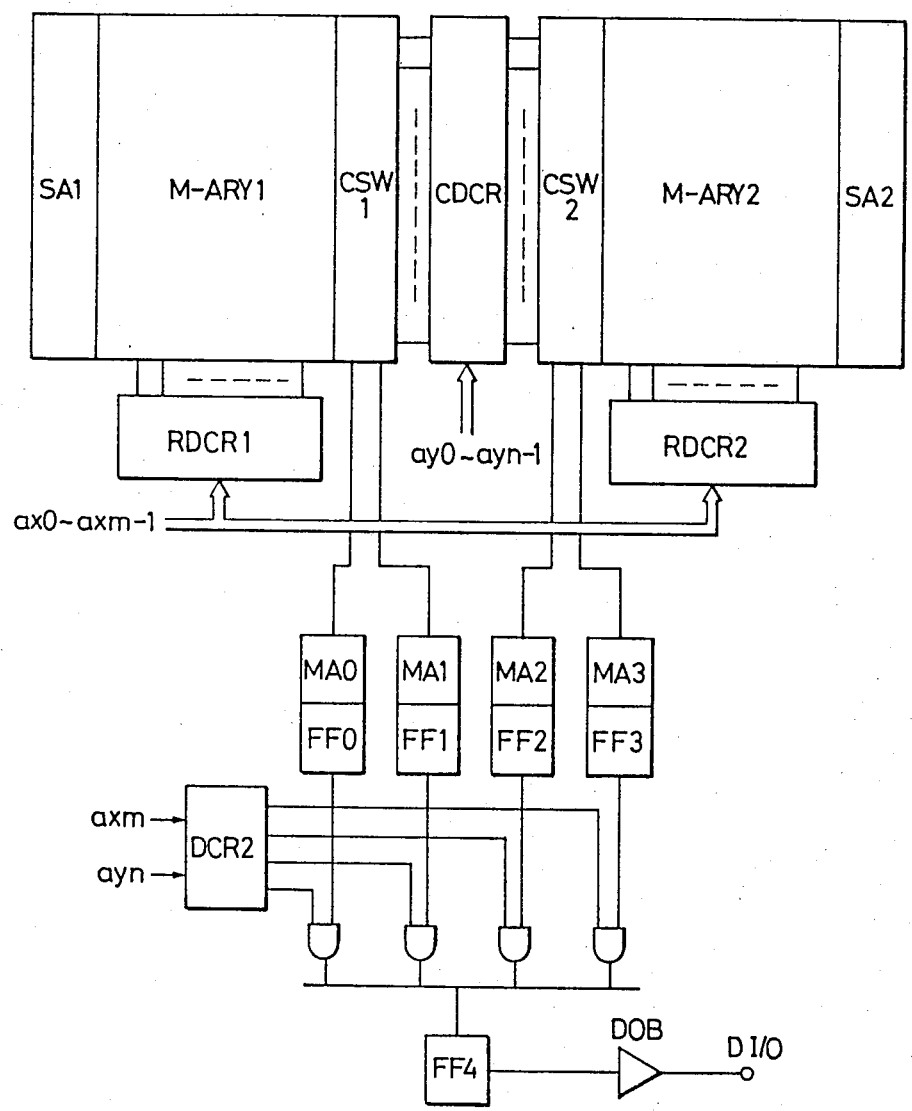
FIG. 6 is a circuit diagram of one example of an input/output circuit in a conventional dynamic RAM.

It should be noted that, when the high level of the signal $\overline{CS}$ is latched, the timing control circuit TC effects control so that an ordinary (or random-access) operation shown in FIG. 5 is effected. In this case, the latched level of the signal $\overline{WE}$ is negated.

In the case of the serial operation mode, address signals AX and AY which are supplied externally are respectively fetched to the address buffers RADB and CADB at the timing at which the chip enable signal $\overline{CE}$ falls, as described above. Further, the output of the address buffer CADB is set as an initial value in the address counter CTR. In FIG. 3, the column address signal AY strobed at the timing at which the chip enable signal $\overline{CE}$ falls and internal complementary address signals corresponding thereto are denoted by the reference symbol As.

The chip select signal $\overline{CS}$, the write enable signal $\overline{WE}$ and the address signals are unnecessary after the judgement of an operation mode made at the timing at which the chip enable signal $\overline{CE}$ falls and the completion of initial setting of the address counter CTR. Accordingly, it is unnecessary to hold these signals on the memory control side, so that the memory control becomes relatively simple. Further, it becomes possible to employ the chip select signal $\overline{CS}$ as pulses for stepping up the address counter CTR. In other words, stepping pulses can be supplied externally without any increase in the number of required external terminals.

A first read operation i started in response to a fall of the chip enable signal $\overline{CE}$. Thereafter, the chip select signal $\overline{CS}$ repeatedly changes between the high and low levels, and in response to this, the built-in address counter CTR is stepped up, and a serial read operation is thus repeated.

The timing signal $\phi x$ for selecting a word line in the memory array M-ARY is held at a high level while a serial read operation is being carried out. The signal $\phi x$ is raised to the high level a predetermined time behind the fall of the signal $\overline{CE}$, and changed from the high level to the low level an extremely short time behind the rise of the signal $\overline{CE}$(substantially simultaneously). The signal $\phi x$ is formed on the basis of an inverted signal which is a predetermined time behind the fall of the signal $\overline{CE}$ and an inverted signal which is extremely short time behind the rise of the signal $\overline{CE}$. The rise of the signal $\phi x$ causes one word line to be selected in accordance with the output of the address buffer RADB.

The data line select timing signal $\phi y$ is raised to the high level prior to the rise of the signal $\phi x$ and slightly behind the fall of the signal $\overline{CE}$. After the first read data has been output to the output circuit, the signal $\phi y$ is once changed from the high level to the low level and then raised to the high level again. The signal $\phi y$ is formed by inverting the signal $\overline{CS}$ except for the operation effected after the first read operation, and the first rise of the signal $\phi y$ is defined by the fall of the signal $\overline{CE}$. In response to the rise of the signal $\phi y$, eight complementary data lines selected in accordance with the output (the signal As, in this case of the address counter CTR are connected to the common complementary data lines CD and $\overline{CD}$.

The signal $\phi pa$ (not shown) is raised to a high level a predetermined time behind the rise of the signal $\phi x$. In consequence, data read out from selected memory cells is amplified by the sense amplifier SA. Subsequently, the signal $\phi ma$ (not shown) is raised to a high level a predetermined time behind the rise of the signal $\phi pa$. In consequence, the signals on the common complementary data lines CD and $\overline{CD}$ are amplified by means of the main amplifier MA.

Prior to the amplifying operation carried out by the main amplifier MA, the signal $\phi n2$ is raised to a high level. The signal $\phi n2$ is formed in such a manner that the level of the signal $\overline{CS}$ at the timing at which the signal $\overline{CE}$ falls is latched and inverted. The signal $\phi n2$ is raised to the high level a predetermined time behind the fall of the signal $\overline{CE}$.

On the other hand, the signal $\phi n1$ is reset to a high level in advance.

Thus, both the signals $\phi n1$ and $\phi n2$ are at the high level only for predetermined period of time, and the clocked inverters CI1 to CI4 are thereby activated. As a result, output signals from the main amplifier MA are simultaneously set in the two flip-flops FFA and FFB, respectively. In FIG. 3, read data corresponding to the address signal As is denoted by the symbol [As] (th same is the case in the following description).

The output enable signal $\overline{OE}$ is shifted to the low level a predetermined time behind the setting of read data in the flip-flop FFB. In other words, the signal $\phi oe$ is raised to a high level. In consequence, the read data [As] in the flip-flop FFB is output to the input/output terminal DI/O as data Do. Thus, the first read operation is completed. It should be noted that the signal $\overline{OE}$ is held at the low level during the serial read operation.

During the first read operation, the following operation is carried out as preparations for reading serial data.

First, after the read data [As] has been set in the flip-flops FFA and FFB, the address counter CTR is stepped up. For this purpose, a first pulse of the signal $\phi c$ is formed. The first pulse of the signal $\phi c$ is formed on the basis of an inverted signal obtained by inverting and delaying the signal $\overline{CE}$ by a predetermined time and a delayed signal obtained by delaying the signal $\overline{CE}$ more than the inverted signal. It should be noted that pulses of the timing signal $\phi c$ which are subsequent to the first pulse are formed at the timing at which the chip select signal $\overline{CS}$ rises from the low level to the high level during a serial operation. In synchronism with the fall of the signal $\phi c$, the address counter CTR is stepped up by one, i.e., from the signal As to the signal As+1.

Secondary, the signal $\phi y$ is first shifted to the low level and then raised to the high level again as described above. The signal $\phi y$ during the first read operation period can be formed on the basis, for example, of a delayed signal obtained by delaying the signal $\overline{CE}$ by a predetermined time and an inverted signal obtained by inverting and delaying the signal $\overline{CE}$ more than the delayed signal.

The timing signal $\phi n1$ is changed from the high level to the low level in synchronism with the first fall of the signal $\phi y$. In consequence, the clocked inverters CI1 and CI2 are made inoperative thereafter. Data which are read out by read operations subsequent to the first read operation are passed through the clocked inverters CI3 and CI4 and successively set in the flip-flop FFA, and then transferred to the flip-flop FFB in synchronism with the rise of the timing signal $\phi s$.

While the signal $\phi y$ is being held at the low level during the first read operation period, the content of the address counter CTR is changed to the signal As+1. Thus, when the signal $\phi y$ is raised to the high level again, the column switch CSW is changed over, and data lines corresponding to the signal As+1 are thereby connected to the common complementary data lines CD and $\overline{CD}$. As a result, read data corresponding to a new column address signal As+1 is amplified by means of the main amplifier MA and set in the flip-flop FFA. At this time, there is no need for the period to obtain the output of the sense amplifier SA, and the output of the main amplifier MA is therefore determined at high speed.

Thereafter, the signal $\overline{CS}$ is allowed to take the high and low levels alternately. As described above, the signal $\phi y$ is formed as an inverted signal of the signal $\overline{CS}$. The signals $\phi s$ and $\phi c$ are formed using the signal $\overline{CS}$ and a signal obtained by inverting and delaying the signal $\overline{CS}$.

Thus, internal address signals formed in the address counter CTR are selected by means of the multiplexer MPX and sent to the column address decoder CDCR which forms data line select signals for selecting data lines. In this way, the column address is successively changed by the stepping-up operation of the address counter CTR, so that read data are successively output through the complementary common data lines CD, $\overline{CD}$ and the main amplifiers MAA and MAB.

In synchronism with the stepping-up operation of the address counter CTR, read data [As], [As+1] . . . [As+n] from column addresses specified by the address counter CTR are successively set in the flip-flop FFA. Since the timing signal $\phi n1$ is at the low level in read operations subsequent to the first read operation, output signals from the flip-flop FFA are shifted and transferred to the flip-flop FFB in synchronism with the rise of the signal $\phi s$. Accordingly, data which are read out in read operations subsequent to the first read operation are set in the flip-flop FFB in synchronism with the rise of the timing signal $\phi s$, and data read out in accordance with a column address which is substantially one behind that of data held in the flip-flop FFA is held in the flip-flop FFB.

As has been described above, the pseudo static RAM to which the present invention is applied is provided with the first flip-flop FFB which transmits read data output from the main amplifier to the output MOSFETs in an ordinary (random) read operation, and the second flip-flop FFA which is connected between the main amplifier and the first flip-flop FFB in a serial read operation so as to shift serial read data and transmit the data to the output MOSFETs in cooperation with the first flip-flop FFB. Accordingly, a plurality of data lines selected by one word line selecting operation are successively specified by means of the address counter CTR, whereby a continuous serial read data items can be obtained. It suffices to provide one set of main amplifiers and one set of flip-flops for transmitting read data, so that the circuit configuration is simplified. In addition, it is only necessary to provide one flip-flop stage through which read data is passed in an ordinary (random) read operation, so that the speed of the ordinary (random) read operation can be increased.

After read data have been output from all memory cells connected to one word line, the signal $\overline{CE}$ is reset to the high level. This reset operation can be effected from the outside of the memory by counting the number of rises of the signal $\overline{CE}$. At this time, since the address counter CTR has a ring-shaped arrangement, read data [As] is set in the flip-flop FFA. When the same serial read data is needed again, it suffices only to repeat the same operation. Since the signal $\overline{CS}$ is reset to the high level after the signal $\overline{CE}$, no signal $\phi s$ is generated.

Figure 4:
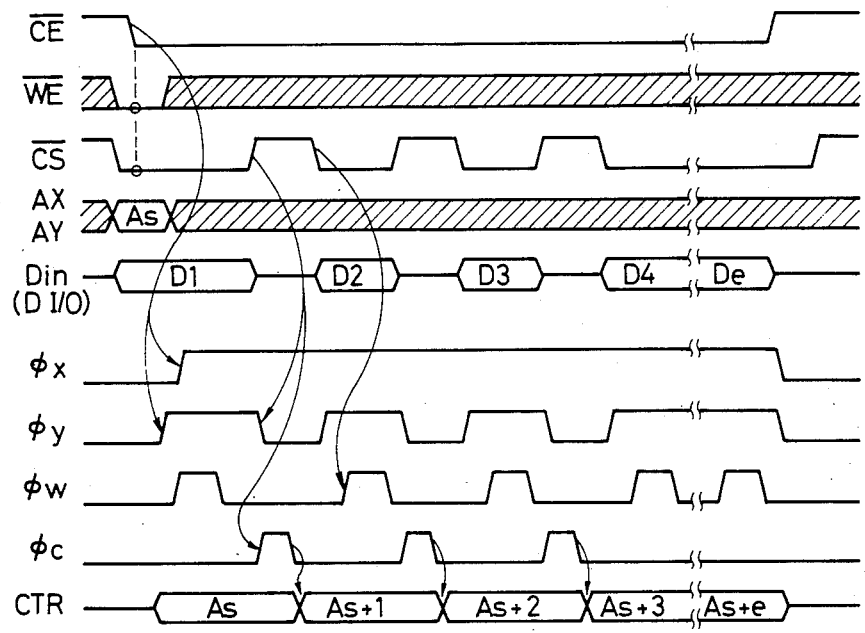
FIG. 4 is a timing chart showing a serial write operation of the dynamic RAM shown in FIG. 2.

FIG. 4 is a timing chart showing the operation of the pseudo static RAM in a serial write operation mode to which RAM the present invention is applied. The timing control circuit TC of this pseudo static RAM identifies a serial write operation mode by detecting the fact that the write enable signal $\overline{WE}$ is at the low level at the time when the chip enable signal $\overline{CE}$ falls from the high level to the low level. Further, Y address signals AY0 to AYj specified externally are initially set in the address counter CTR as a start address As with which writing is started in the same way as in the case of the serial read operation mode. The signals $\phi x$, $\phi y$ and $\phi pa$ are generated a predetermined time behind the fall of the signal $\overline{CE}$ in the same way as in the case of the serial read operation. In consequence, eight selected memory cells and the common complementary data lines are connected.

Unlike the first pulse of the timing signal $\phi c$ for stepping up the address counter CTR in the serial read operation mode, said first pulse in the serial write operation mode is not formed on the basis of the signal $\overline{CE}$. Accordingly, the column address set in the address counter CTR at the time when a write timing signal $\phi w$ for effecting a first write operation is left being the write start address As. Thereafter, pulses of the stepping timing signal $\phi c$ are generated in synchronism with the rise of the chip select signal $\overline{CS}$, and the address counter CTR is stepped up in synchronism with the fall of the timing signal $\phi c$.

The signal $\phi w$ is generated on the basis of the fall of the signal $\overline{CS}$ in the serial write operation. A first pulse of the signal $\phi w$ is formed a predetermined time behind the fall of the signal $\overline{CE}$ on the basis of the low level of the signal $\overline{CS}$.

After the completion of the first write operation, the chip select signal $\overline{CS}$ is repeatedly changed between the low and high levels. In consequence, the address counter CTR is stepped up to change the column address successively, and the signal $\phi y$ is formed by inverting the signal $\overline{CS}$, thus effecting a serial write operation. Further, the write data which is supplied to the input/output terminal DI/O is changed in synchronism with the change of the chip select signal $\overline{CS}$, so that write data having a predetermined pattern can be consecutively written into consecutive addresses. More specifically, write data D0, D1 ... De which are supplied to the input/output terminal DI/O are consecutively written into memory cells corresponding to write addresses As, As+1 ... As+e which are successively specified in the address counter CTR.

The difference between voltages supplied to the common complementary data lines CD and $\overline{CD}$ by the operation of the write circuit DIB is relatively large, i.e., about 5 V. Since the write operation can be effected at higher speed than the read operation, there is no particular need for an arrangement such as that of the read circuit.

FIG. 5 is a timing chart showing the operation of the pseudo static RAM in the random-access operation mode to which RAM the present invention is applied. The timing control circuit TC in the pseudo static RAM identifies the random-access operation mode by detecting the fact that the signal $\overline{CS}$ is at the high level at the time when the chip enable signal $\overline{CE}$ falls from the high level to the low level.

External address signals AX (AX0 to AXi) and AY (AY0 to AYj) are fetched to the address buffers RADB and CADB, respectively, in synchronism with the fall of the signal $\overline{CE}$ in the same way as in the case of the serial operation mode. Internal complementary address signals ax0 to axi and ay0 to ayj are sent to address decoders RDCR and CDCR from the address buffers RADB and CADB, respectively. At this time, the timing control circuit TC makes the address counter CTR inoperative and activates the multiplexer MPX so as to select and output signals from the address buffer CADB.

The signals $\phi x$ and $\phi y$ are raised to high levels appropriately behind the fall of the signal $\overline{CE}$. As a result, eight memory cells corresponding to one address are selected. The signal $\phi pa$ and $\phi ma$ (not shown) are raised to high levels appropriately behind the rise of the signal $\phi x$. The signal $\phi n1$ is at a high level which is a reset level, while the signal $\phi n2$ is never raised to a high level. Thus, the outputs of the main amplifiers MMA and MMB are passed through the clocked inverter circuits CI1 and CI2 and set in the flip-flop FFB.

To read out data from selected memory cells, the output enable signal $\overline{OE}$ is raised to a high level at the predetermined timing. In other words, the signal $\phi oe$ is raised to a high level. Accordingly, data in the flip-flop FFB is output to the input/output terminal DI/O.

To write data into selected memory cells, the write enable signal $\overline{WE}$ is shifted to the low level at the timing shown by the chain line in FIG. 5, and the signal $\overline{OE}$ is held at the high level (i.e., the signal $\phi oe$ is held at the low level). Thus, the write circuit DIB is made operative, and complementary signals corresponding to data supplied to the input/output terminal DI/O are applied to the common complementary data lines CD and $\overline{CD}$.

The difference between voltages supplied to the common complementary data lines CD and $\overline{CD}$ by the operation of the sense amplifier SA at the time of selection of memory cells is about 200 mV, whereas said voltage difference by the operation of the write circuit DIB is about 5 V. Accordingly, new write data is stored in the selected memory cells regardless of read data.

As shown in the above-described embodiment, when the present invention is applied to a semiconductor memory having a serial operation mode function, the following advantageous effects are obtained:

(1) In the stage subsequent to an amplifier for amplifying read signals from memory cells which are output to complementary common data lines, there are provided a first flip-flop for transmitting the output signal from the amplifier to an output buffer in an ordinary read operation, a second flip-flop which is connected between the amplifier and the first flip-flop in a serial read operation and which transmits the output signal from the amplifier to the output buffer in cooperation with the first flip-flop, and an address counter for successively selecting a plurality of data lines. Thus, it is possible to realize a semiconductor memory having a function which enables serial read and write operations with a relatively simple circuit configuration.

(2) An address for starting a serial read or write operation in the paragraph (1) can be set as desired by initially setting a column address in the address counter, the column address being supplied to start a serial operation. An address for ending a serial read or write operation can be specified as desired by changing the chip enable signal $\overline{CE}$ from the low level to the high level when an operation of reading or writing an address for suspending a serial operation has been completed. Accordingly, it is possible to select as desired an address for effecting a serial read or write operation.

(3) The above-described serial operation can be effected without any need to change address signals which are supplied externally. It is therefore unnecessary to provide any margin for skew or the like caused by the change of a plurality of address signals, and it is possible to realize a semiconductor memory capable of performing a relatively high speed serial operation.

(4) The above-described serial operation is specified to be in a read or write mode in accordance with the level of the write enable signal $\overline{WE}$ at the time when the chip enable signal $\overline{CE}$ falls from the high level to the low level, and the address signal at that time is set in the address buffer or in the address counter. Accordingly, it is unnecessary to hold thereafter the write enable signal $\overline{WE}$ and the address signal during the serial operation, so that the memory control can be simplified.

Although the invention accomplished by the present inventor has practically been described by way of one embodiment, the present invention is not necessarily limited to the described embodiment and various changes and modifications may, of course, be imparted thereto without departing from the scope and spirit of the invention.

The signal $\phi n2$ shown in FIG. 3 may be formed as a signal which is anti-phase with respect to the signal $\phi s$. In the case of a random-access output operation, it is only necessary that either one of the signals $\phi s$ and $\phi n2$ be at the low level. The transfer of data from the flip-flop FFA to the flip-flop FFB may be effected in such a manner that the signal $\phi s$ is maintained at the high level and the signal $\phi n2$ is repeatedly changed between the high and low levels.

Data which is first read out may be latched in only one of the flip-flops FFA and FFB. In this case, the timing at which the signal φn1 falls or the timing at which the signal φn2 rises is appropriately altered.

Designation of the operation modes may be made using other appropriate methods.

The arrangement may be such that a row address signal (X address signal) and a column address signal (Y address signal) which are supplied externally are supplied to one set of address input terminals and signal lines in an address multiplex manner. In this case, a row address strobe signal $\overline{RAS}$ and a column address strobe signal $\overline{CAS}$ may be employed in place of the chip select signal $\overline{CS}$ and the chip enable signal $\overline{CE}$, respectively.

The address counter CTR may use a refresh counter which is employed for an internal automatic refresh operation. The address counter CTR is not necessarily arranged so that the final bit signal is fed back to the first bit. The arrangement may be such that a serial operation mode is ended when the timing control circuit TC recognizes that a select signal has been set at the final bit of the address counter CTR. The arrangement may also be such that the timing control circuit TC detects the fact that a select signal has been set at the final bit, and outputs an end signal to an external terminal.

Data may be input and output through independent external terminals. The number of data input/output terminal or the number of sets of data input terminals and data output terminals may be 1, 2, 4, 16 or the like.

The output of the address counter CTR may be input to the column address buffer CADB. In this case, the column address buffer CADB has the same function as the multiplexer MPX. The address buffer CADB outputs only a first column address signal in a serial operation as it is, and thereafter, the buffer CADB selectively outputs the output of the address counter by virtue of its multiplexing function. Since, in this example, the output of the address buffer CADB is input to the address decoder CDCR, the speed of a random-access operation can be increased.

Although in this embodiment the memory array M-ARY is a single memory matrix, it may be composed of a plurality of memory matrixes. The circuit configurations of the main amplifier, the input/output circuit I/O and the like and the combination of a variety of kinds of timing signal may be changed variously.

Although in the above-described embodiment the present invention is applied to a pseudo static RAM, the invention is not necessarily limitative thereto.

For example, the present invention may be applied to other known RAMs such as dynamic and static RAMs. Further, the present invention may be applied to other known ROMs such as mask type read-only memory (ROM), erasable and programmable ROM (EPROM) and electrically erasable and programmable ROM (EEPROM).

The present invention is applicable to semiconductor memories having at least a storage data output function and enables realization of a high-speed and serial data read function.

What is claimed is:

1. A semiconductor memory comprising:
a memory array including a plurality of memory cells for storing data;
first data holding means for receiving data read out from said memory array through a first switching circuit; and
second data holding means for receiving data read out form said memory array through a second switching circuit, the output of said second data holding means being transmitted to said first data holding means through a third switching circuit;
wherein, in a random-access output operation, said first switching circuit is closed, while at least either one of said second and third switching circuits is opened, whereby said read data is output through said first data holding means, and wherein, in a serial output operation, said first switching circuit is opened, while said second switching means is closed and said third switching circuit is opened and closed at a predetermined timing, whereby said plurality of read data are output serially through said first and second data holding means.

2. A semiconductor memory according to claim 1, wherein the data read out from said memory array is constituted by a plurality of bits which are read out in parallel, said first, second and third switching circuits and said first and second data holding means being provided in correspondence with each of the bits constituting said data.

3. A semiconductor memory comprising;
a memory array having a plurality of word lines, a plurality of data lines and memory cells respectively coupled between said word and data lines;
an amplifier circuit for amplifying data read out from said memory array;
a common data line provided between said memory array and said amplifier circuit;
first selecting means for selecting said word lines on the basis of a row address signal;
second selecting means for selectively connecting said data lines to said common data line on the basis of a column address signal;
first data holding means for receiving an output signal form said amplifier circuit through a first switching circuit;
second data holding means for receiving an output signal from said amplifier circuit through a second switching circuit, the output of said second data holding means being transmitted to said first data holding means through a third switching circuit; and
a signal generating circuit forming an address signal which is supplied to said second selecting means;
wherein, in a random-access output operation, said first switching circuit is closed, while at least either one of said second and third switching circuits is opened, whereby the output of said amplifier circuit is output through said first data holding means, and wherein, in a serial output operation, said second selecting means in response to the operation of said signal generating circuit sequentially connect said plurality of data lines to said common data line, and said first switching circuit is opened, while said second switching means is closed and said third switching circuit is opened and closed at a predetermined timing, whereby a plurality of outputs of said amplifier circuit are output serially through said first and second data holding means.

4. A semiconductor memory according to claim 3, wherein said signal generating circuit forms an address signal to supply said second selecting means in response to a control signal supplied from an external terminal.

5. A semiconductor memory according to claim 4, wherein said signal generating circuit is defined by a counter circuit which performs a step-up operation in response to a control signal supplied from an external terminal, the initial value for said counter circuit being given as a column address signal.

6. A semiconductor memory according to claim 4, wherein a signal for controlling said second switching circuit and a timing signal in response to which said second selecting means selectively connects said data lines to said common data line are formed on the basis of said control signal.

7. A semiconductor memory according to claim 3, wherein said memory cells are of the dynamic type, said amplifier circuit and said first and second data holding means being respectively constituted by static type circuits, said row and column address signals are respectively supplied from external terminals which are independent of each other, data read out from said memory array is constituted by a plurality of bits which are read out in parallel, and said amplifier circuit, said first, second and third switching circuits and said first and second data holding means are provided in correspondence with each of the bits constituting said data.

8. A semiconductor memory comprising:
a memory array including a plurality of memory cells for storing data;
first data holding means for receiving data read out from said memory array through a first switching circuit, said data being constituted by a plurality of bits which are read out in parallel, and said first switching circuit and said first data holding means being provided in correspondence with each of the bits constituting said data; and
second data holding means for providing data output to said first data holding means from a second switching circuit, said second switching circuit and said second data holding means being provided in correspondence with each of the bits constituting said data;
wherein said first and second switching circuits are opened and closed at a predetermined timing, whereby a plurality of data read out from said memory array are output serially through said first and second data holding means.

9. A semiconductor memory comprising:
a memory array including a plurality of memory cells for storing data;
an output means for outputting data read out form said memory array, said data being constituted by a plurality of bits which are read out in parallel, and said output means being provided in correspondence with each of the bits constituting said data and having a function to output a plurality of data serially read out from said memory array, wherein said output means has first data holding means for receiving data read out from said memory array through a first switching circuit, and
second data holding means for receiving data read out from said memory array, the output of said second data holding means being transmitted to said first data holding means through a second switching circuit,
wherein, in a random-access output operation, said first switching circuit is closed, while said second switching circuits is opened, whereby said read data is output through said first data holding means, and wherein, in a serial output operation, said first switching circuit is opened, while said second switching circuit is opened and closed at a predetermined timing, whereby said plurality of read data are output serially through said first and second data holding means; and
a plurality of external terminals each provided in correspondence with said output circuit, said terminals being employed to, at least, output said data.

* * * * *